United States Patent [19]

Yanazawa et al.

[11] 3,942,982

[45] Mar. 9, 1976

[54] METHOD FOR CONTROLLING THE DEGREE OF SIDE-ETCH IN THIN OXIDE FILMS BY PHOTO-ETCHING PROCESS

[75] Inventors: Hiroshi Yanazawa, Tokyo; Norikazu Hashimoto, Tokorozawa; Mikio Ashikawa, Koganei; Kikuo Douta, Hachioji, all of Japan

[73] Assignee: Hitachi, Ltd., Japan

[22] Filed: May 6, 1974

[21] Appl. No.: 467,606

[30] Foreign Application Priority Data
May 4, 1973  Japan.................... 48-49097

[52] U.S. Cl............. 96/36; 96/36.2; 156/8; 156/17
[51] Int. Cl.²............ G03C 5/00; B60B 9/00
[58] Field of Search........ 96/36, 36.2, 35.1; 117/38, 117/34; 156/7, 8, 17

[56] References Cited
UNITED STATES PATENTS

| 3,405,017 | 10/1968 | Gee | 96/36.2 |
|---|---|---|---|
| 3,520,683 | 7/1970 | Kerwin | 96/35.1 |
| 3,586,554 | 6/1971 | Couture et al. | 96/36 |
| 3,716,390 | 2/1973 | Garbarini | 117/34 |
| 3,482,977 | 12/1969· | Baker | 96/36.2 |

OTHER PUBLICATIONS

Pillot, "Mesa Etching Process Using Photolithographic Techniques," *IBM Tech. Discl. Bull.*, Vol. 15, No. 7, 12/72.

*Primary Examiner*—Edward C. Kimlin
*Attorney, Agent, or Firm*—Craig & Antonelli

[57] ABSTRACT

In selectively etching a solid oxide thin film which has chemisorbed water (surface hydroxyl groups) in its surface, the thin film is surface-treated with an organic compound which has within its molecule a functional group to react with the surface hydroxyl groups. Thereafter, photo-etching is performed by the conventional method by applying a thin film of a photosensitive organic polymer onto the treated thin film. Through selection of the sort of the organic compound, the degree of side-etch arising in the process of the selective etch can be controlled.

9 Claims, 7 Drawing Figures

METHOD FOR CONTROLLING THE DEGREE OF SIDE-ETCH IN THIN OXIDE FILMS BY PHOTO-ETCHING PROCESS

BACKGROUND OF THE INVENTION

1. Field of the Invention

The present invention relates to a method for controlling the degree of side-etch occuring in case of selectively etching a solid oxide thin film, especialy of silicon oxides, which is used for a semiconductor device and which has surface hydroxyl groups on its surface.

2. Description of the Prior Art

Photo-etching is a technique for protecting selected areas of the surface of a thin film by an organic polymer and etching the remaining portion of the surface in the manufacture of various articles such as semiconductor devices and printed circuit cards.

Concretely, the photosensitive organic polymer generally termed "photoresist" (including two sorts of the negative type photo-resist and the positive type photoresist, the former of which is polymerized and becomes insoluble in a solvent when exposed to light and the latter is depolymerized and becomes soluble when exposed to light) is applied onto the surface of the thin film. The photoresist is exposed to light through a mask of black and white, to polymerize the photoresist at the selected areas (depolymerize the same in case of the positive type photoresist) and render it insoluble (soluble in case of the positive type photoresist) in the solvent. Thereafter, the photoresist in the unpolymerized portion is dissolved and removed. Through a photoresist mask thus formed on the thin film, the selected areas of the thin film are chemically etched.

The prior art photo-etching technique has the disadvantage that when the film material with the photoresist applied as the mask is immersed in an etchant, the etchant permeates between the photoresist material and the thin film material due to inferior affinity between both the materials. This gives rise to the side-etch (the proceeding of etching to the part of the thin film to-be-protected), so that a fine pattern is not etched at good reproducibility.

In some extreme cases, the photoresist exfoliates from the surface of the thin film, and its effect as the mask is fully lost.

It is considered that such phenomena are prone to arise where the affinity between the thin film and the photoresist is bad. In order to reduce the side-etch, a variety of measures have hitherto been adopted. These measures include conducting the baking after applying the photoresist on the thin film material, adding an adhesion accelerator or a surface-active agent at the etchant and changing the composition or temperature of the etchant so as to increase the etching rate.

Since, however, the property of the surface of the thin film greatly differs in dependence on, not only the sort of the material of the thin film, but also the process history, etc. thereof, it has been very difficult with the prior-art technique to perform a photo-etching working of high finishing accuracy at good reproducibility.

In the case of subjecting a thin film material, 1 $\mu$m – several $\mu$m thick, to the photo-etching working, a phenomenon just converse to the foregoing problem is sometimes the cause for generating defectives. For example, where after forming an uneven pattern in the first thin film of a thickness of several $\mu$m by the photo-etching working, the second thin film is to be formed thereon, it can occur that the formation of the second thin film is partially obstructed by the unevenness of the first thin film or that the second thin film formed severs on the end part of a convex portion of the first thin film.

In such case, it is desirable to make the unevenness of the first thin film less severe. In other words, it is desirable that the degree of side-etch can be controlled in the photo-etching working.

SUMMARY OF THE INVENTION

An object of the present invention is to solve the problems in the photo-etching working as stated above, and to control the worked profile of a thin film material by photo-etching by controlling the degree of side-etch (i.e., to reduce or in some cases to increase the degree of side-etch).

Another object of the present invention is to enhance the reproducibility of the photo-etching working by deliberately making certain surface properties irrespective of the history of a thin film material.

The objects are accomplished as stated below.

It is generally considered that thin films of silicon aluminum, etc., have their surface layer oxidized under the influences of oxygen, moisture, etc., in the atmosphere air, and that the properties of the surfaces of these thin films are similar to the properties of their oxides. Accordingly, the case of a thin $SiO_2$ film is taken as an example.

Figure 1:
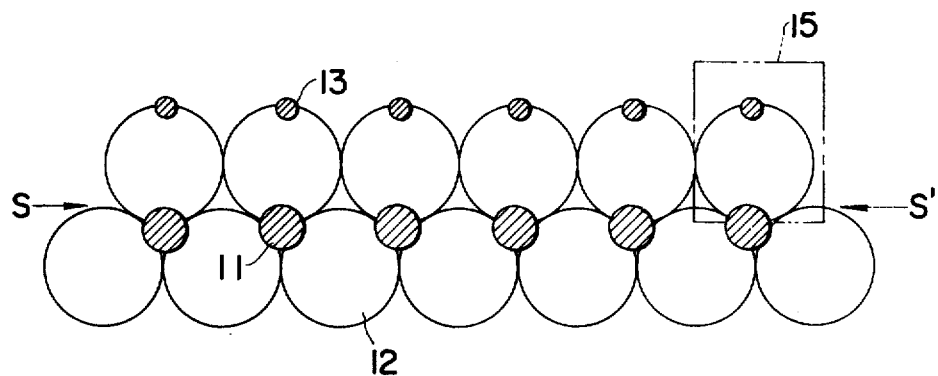
FIG. 1 is a model-like sectional view of a usual $SiO_2$ surface.

FIG. 1 illustrates a surface structure of usual $SiO_2$ in a model-like manner. A surface S – S' is of a cross-linked structure which consists of $Si^{4+}$ ions 11 and $O^{2-}$ ions 12. Onto the $Si^{4+}$ ions 11 exposed to the surface, $H_2O$ in the atmospheric air is chemisorbed, to form surface hydroxyl groups 15 (—OH). In the figure, a circle just above the surface S – S' represents an oxygen atom, and a small circle 13 with oblique lines represents a hydrogen atom. Since the surface hydroxyl groups are chemically reative, organic radicals can be formed on the thin film surface in such a way that, as will be described later, the thin film is surface-treated under specified conditions by the use of an organic compound such as alcohol, silane derivatives, silylamine derivatives and phenols containing active hydrogen atoms, halogen atoms, nitrogen atoms, etc. within its molecules.

Figure 2:
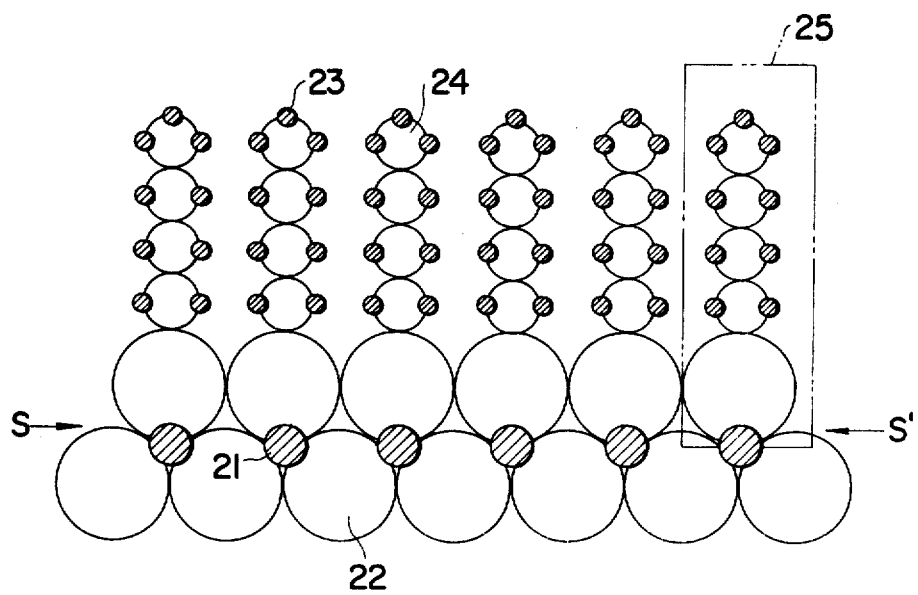
FIG. 2 is a sectional view showing a model-like manner an $SiO_2$ surface subjected to a surface treatment with butanol.

More specifically, as illustrated in FIG. 2, when the $SiO_2$ surface is treted with butanol, butoxy groups 25 can be formed on the $SiO_2$ surface S – S'. The property of the surface thus covered with the organic radicals is determined by the property and number of the organic radicals.

In FIG. 2, reference numeral 21 designates an $Si^{4+}$ ion, 22 an $O^{2-}$ ion, 23 a hydrogen atom and 24 a carbon atom.

The hydroxyl groups 15 in FIG. 1 are substituted by the butoxy groups in FIG. 2. The organic radicals represented by the butoxy groups affect the affinity between the photoresist and the thin film surface.

The subject matter of the present invention is based on the finding that organic radicals are stuck to the thin film surface by the chemical procedure as explained above, thereby providing means to deliberately control the property of the thin film surface and to regulate the degree of side-etch.

According to the photo-etching method of the present invention, the $SiO_2$ surface has its property turned from hydrophilic to lyophilic (which can alternatively be called hydrophobic) by a certain kind or organic radicals, so that the affinity between the $SiO_2$ surface and the photoresist is improved, with the result that the permeation of an etchant between the $SiO_2$ surface and the photoresist is reduced and that the degree of side-etch diminishes. To the contrary, another kind of organic radical can increase the side-etch.

In other words, the photo-etching method according to the present invention consists in that, before performing the conventional photo-etching, a solid oxide thin film having chemisorbed hydroxyl groups on its surface is surface-treated by an organic compound which has within its molecule a functional group reacting with the hydroxyl group. As regards the method of the surface treatment, the same operating procedures apply irrespective of the materials of the thin films to be surface-treated. Therefore, the procedures will be collectively explained here.

(1). Surface treatment with Alcohol

The method to be now stated is applicable to all the alcohols of primary and secondary alcohols, monofunctional and polyfunctional alcohols and aliphatic and aromatic alcohols and to phenols. The following exemplifies a case of the surface treatment with n-butanol ($n-C_4H_9OH$).

A thin film specimen and 66 ml of butanol are placed in an autoclave made of stainless steel (one of a capacity of 200 ml was used in our case). After substituting air within the autoclave with dry nitrogen, the autoclave is hermetically closed. Subsequently, the autoclave is gradually heated while continuously measuring the temperature and pressure in the autoclave. When the temperature and pressure in the autoclave have reached critical conditions (288°C. and 49 atmospheres in the case of butanol), the heating is stopped. The autoclave is opened to permit butanol vapor to blow out, and is let to stand for cooling. Such method is termed the autoclave method.

While the ideal conditions of the surface treatment with alcohol has been described above, the surface treatment can also be performed under conditions stated below.

It is possible that the alcohol is used in the form of a solution employing a nonpolar organic solvent such as n-hexane ($n-C_6H_{14}$), and that the reaction is carried out caused at the critical temperature of the solvent. This method is valuable, in case of using an alcohol of high critical temperature, to lower the reaction temperature (the critical temperature of n-hexane is 235°C.).

The reaction temperature and pressure need not always be the critical temperature and the critical pressure. However, a temperature above the boiling point of the alcohol and a pressure above the atmospheric pressure are required.

When the thin film surface is treated with alcohol by the method stated above, the hydroxyl group on the thin film surface is substituted into an alkexy group. In this reaction, the condensation with elimination of water takes place between the hydroxyl group of the alcohol and the surface hydroxyl group on the thin film surface. The reaction mechanism is described in U.S. Pat. No. 2,913,358.

(2). Surface Treatment with Silane Derivative

The method to be described here is applicable to all the silane derivatives such as trimethylchlorosilane (($CH_3)_3SiCl$) and trimethylmethoxysilane (($CH_3)_3Si-OCH_3$). Descriptionn will be made of a case of the trimethylchlorosilane treatment.

A thin film specimen placed in a quartz sample tube is vacuum-evacuatd at 200°C. under $5 \times 10^{-5}$ Torr. for 2 hours. Thereafter, the sample tube is shut off from a vacuum pump. Subsequently, 50 Torr. of trimethylchlorosilane vapor is introduced into the sample tube. The thin film surface is exposed to the vapor, and the tube is let to stand in this state for at least 1 hour.

By following the above operations, the condensation with elimination of hydrogen chloride is induced between the hydroxyl group of the thin film surface and the trimethylchlorosilane. As the result, an organic radical $(OH_3)_3SiO$— can be formed on the thin film surface. Such method is named the vapor phase reaction method.

In this operating method, the thin film specimen is vacuum-evacuated before being exposed to the trimethylchlorosilane vapor. The vacuum evacuation is for removing physically adsorbed water on the surface hydroxyl group (chemically adsorbed water) of the thin film so as to make the surface hydroxyl group more reactive, and it does not restrict the operating method.

(3). Surface Treatment with Silylamine Derivative

The surface treatment with any of silylamine derivatives represented by hexamethyldisilazane (($CH_3)_3SiNHS:(CH_3)_3$) can be carried out by the vapor phase reaction method quite similar to the foregoing case of silane derivatives. Herein, the condensation with elimination of ammonia takes place between the hydroxyl group of the thin film surface and the hexamethyldisilazane.

(4). Surface Treatment with Phenol or its Derivative

This method modifies the property of a thin film surface by performing the surface treatment of a thin film material with any of the phenols, such as phenol, cresol, catechol, pyrogallol, aminophenol, phenol halide and nitrophenol, and phenol derivatives.

A solution in which 10 gr. of phenol is dissolved in 60 ml of n-hexane, and a thin film specimen are placed in an autoclave made of stainless steel and having a capacity of 200 ml.

Subsequently, air within the autoclave is replaced by dry nitrogen, and the autoclave is hermetically closed. While measuring the temperature and pressure in the autoclave, the autoclave is gradually heated to 235°C. (the rate of rising the temperature is about 8°C/min.). The raised temperature is held for 30 minutes, to cause the phenol to react on the thin film surface. During this period, the pressure in the autoclave is 38 atmospheres. Lastly, the autoclave is opened, has vapor in the interior blown out, and is let to stand for cooling.

When the thin film surface is treated with phenol or its drivative by the method stated above, the dehydration reaction takes place between the hydroxyl group of the phenol and the hydroxyl group of the thin film surface, and a phenoxyl group is formed on the thin film surface.

Quite the same operations can be applied to alkyl-, alkene-, aromatic-, amino- and halogen-substituted derivatives of phenol, such as cresol, anol, thymol, hydroxydiphenyl, aminophenol and chlorophenol. Mixed solutions consisting of these compounds and alcohols can also achieve similar effects.

By performing the surface treatment with the organic substance in conformity to the methods described above, the property of the thin fim surface is modified, with the result that the degree of side-etch can be controlled. In order to clarify the effect of the surface treatment, the invention will be explained in detail hereunder in connection with specific embodiments.

The surfce treatment process of the present invention can be applied to all the thin film material of oxides, silicon, etc. Of the oxides, $SiO_2$ and metal oxides such as $Al_2O_3$ are particularly noteworthy. Here, description will be made of a polycrystalline silicon film which has been known to be extremely side-etched with the conventional method and an $SiO_2$ film which has been known to be, conversely, little side-etched.

DESCRIPTION OF THE PREFERRED EMBODIMENTS

Embodiment 1

The effect of the present invention in the photo-etching working of a polycrystalline silicon film will be explained.

First, on a silicon wafer with its surface oxidized by about 5,000 A, polycrystalline silicon was formed by about 5,000 A by thermal decomposition of silane at 650°C.

Subsequently, in accordance with the foregoing methods, surface treatments were conducted with alcohols, a silane derivative and a silylamine derivative.

Conditions of the surface treatments are listed in Table 1.

Table 1

| Conditions of Surface Treatments With Organic Substances | | | |
|---|---|---|---|
| Organic Substance (Chemical Formula) | Temperature (°C) | Pressure (atm.) | Remarks |
| Methanol ($CH_3OH$) | 240 | 78 | |
| Ethanol ($C_2H_5OH$) | 243 | 63 | |
| Propanol ($C_3H_7OH$) | 263 | 50 | autoclave method |
| Butanol ($C_4H_9OH$) | 288 | 49 | |
| Pentanol ($C_6H_{11}OH$) | 300 | 26 | |
| Decanol ($C_{10}H_{21}OH$) | 300 | 22 | |
| Trimethylchlorosilane (($CH_3)_3SiCl$) | 200 | 0.1 | vapor phase reaction method |
| Hexamethyldisilazane (($CH_3)_3SiNHSi(CH_3)_3$) | 200 | 0.1 | |

Using a negative type photoresist containing polyisoprene as its main component, for example, OMR (i.e., a product of Tokyo Oka Co.), KTFR (i.e., a product of Kodak), etc., which, among photoresists commercially available, is considered to be very poor in the affinity with the polycrystalline silicon, a photo-etching working was carried out by the conventional method. An etchant was a mixed solution consisting of HF, $HNO_3$ and $CH_3COOH$ (1 : 50 : 25 in volumetric ratio), at a temperature of 22°C. Since the etching rate was approximately 2,500 A/min., the polycrystalline silicon film 5,000 A thick could be etched in about 2 minutes.

Figure 3:
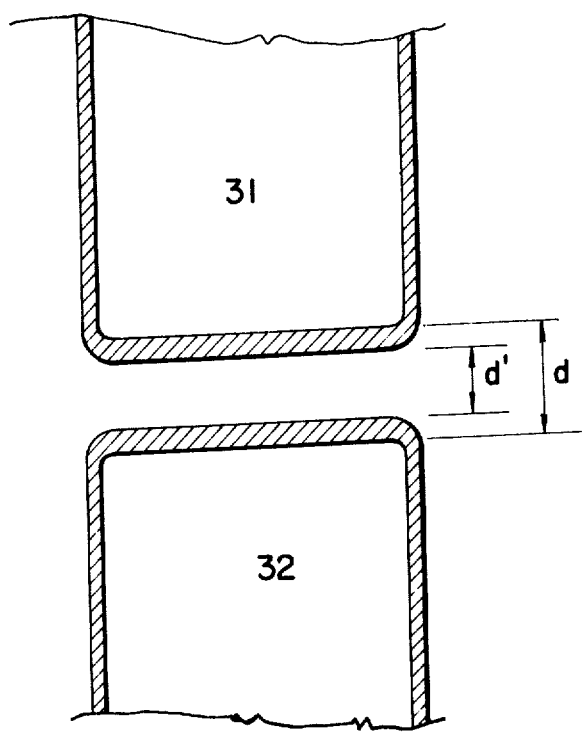
FIG. 3 shows perspective views of photo-etched surfaces of a polycrystal silicon film as correspond to FIGS. 4 to 7.

In order that the effect of the surface treatment according to the present invention may be intuitively understood, scanning electron microscope-photographs of the surfaces after the etching are shown in FIGS. 4 to 7. FIG. 3 ilustrates in a model-like manner the structures of the photographs shown in FIGS. 4 to 7.

More specifically, by the photo-etching working, two etch pits are formed at each of parts 31 and 32 of the polycrystalline silicon film and at intervals of 20 $\mu$m. The oblique line portion is a section of the side-etched polycrystalline silicon film.

If there is quite no side-etch, both the intervals $d$ and $d'$ ought to become 20 $\mu$m (mask dimensions). In actuality, the interval is shorter on account of the side-etch.

Figure 4:
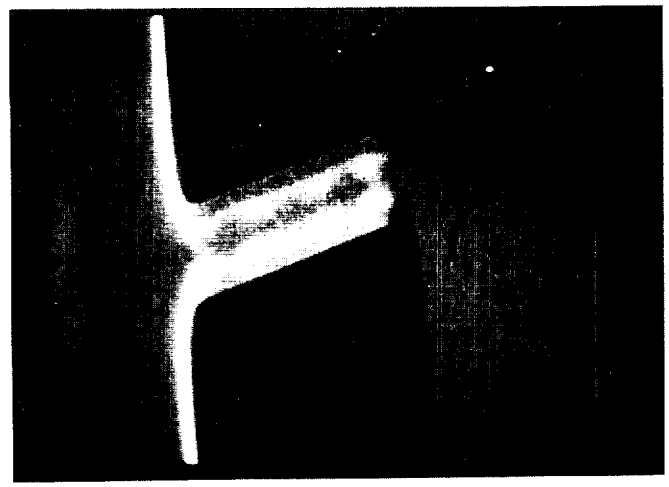
FIGS. 4 to 7 are photographs obtained when the photo-etched surfaces of a specimen with polycrystalline silicon deposited and with no surface treatment made, a specimen subjected to a surface treatment with butanol, a specimen subjected to a surface treatment with trimethylchlorosilane and a specimen subjected to a surface treatment with hexamethyldisilazane were observed by a scanning electron microscope ($\times 1300$), respepctively.
Figure 5:
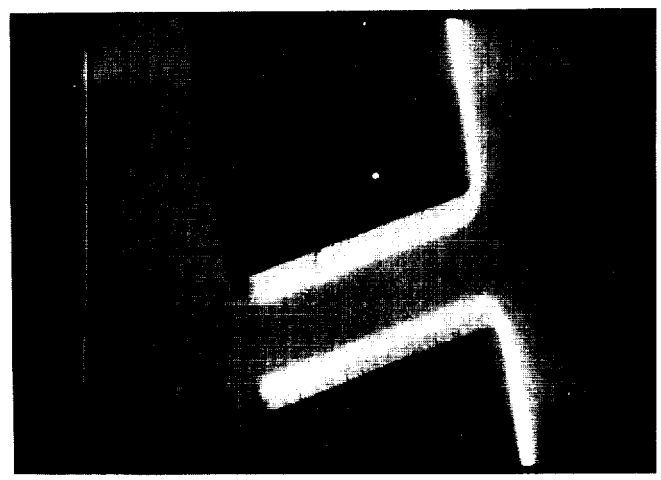
Figure 6:
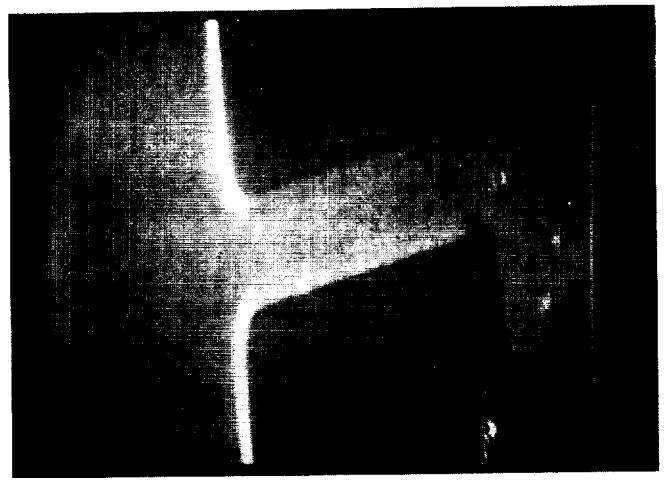
Figure 7:
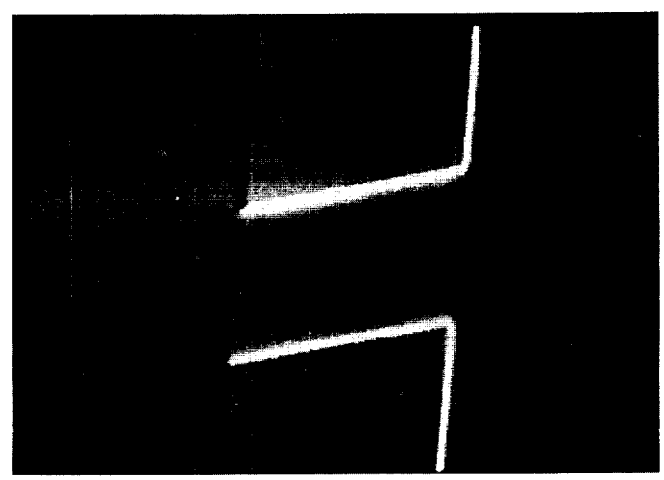

FIG. 4 corresponds to the polycrystalline film which has been untreated, FIG. 5 corresponds to that subjected to the surface treatment with butanol, FIG. 6 corresponds to that subjected to the surface treatment with trimethylchlorosilane, and FIG. 7 corresponds to that subjected to the surface treatment with hexamethyldisilazane. By comparisons of the four typical examples shown in FIGS. 4 to 7, it is understood that the degree of side-etch in the photo-etching working can be controlled by applying the surface treatment process according to the present invention.

Further, in order to quantitatively demonstrate the effect of the present invention, measured results of the etch factor which is defined by the following equation (1) will be given:

$$(\text{etch factor}) = \frac{(\text{thickness of thin film})}{(\text{degree of side-etch})} \quad (1)$$

$$(\text{degree of side-etch}) = (d - d')/2$$

Table 2 compares the etch factors of polycrystalline silicon films subjected to various surface treatments, with that of an untreated polycrystalline silicon film.

Table 2

| Etch Factors of Polycrystalline Silicon Films | | |
|---|---|---|
| Agent of Surface Treatment | Thickness of Polycrystalline Silicon | Etch Factor |
| (untreated) | 5,500 A | 0.06 |
| methanol | 6,000 | 0.14 |
| ethanol | 5,700 | 0.16 |
| n-propanol | 5,600 | 0.29 |
| n-butanol | 5,100 | 0.61 |
| n-pentanol | 5,300 | 0.29 |
| n-decanol | 5,600 | 0.25 |
| trimethylchlorosilane | 5,100 | 0.26 |
| hexamethyldisilazane | 5,000 | 1.0 |

As understood from the examples in Table 2, in the case of photo-etching the polycrystalline silicon film, the untreated specimen has a very great degree of side-etch and consequently has etch factors as small as 0.06, whereas the application of the surface treatment process of the present invention makes it possible to control the etch factor in a range of 0.14 – 1.0.

Embodiment 2

Description will now be made of the photo-etching working of $SiO_2$ which is formed by the chemical vapor deposition (abbreviated to CVD in this specification). Used as each specimen was a CVD·$SiO_2$ film deposited on a silicon wafer by oxidizing silane at 430°C. KTFR (i.e., a product of Kodak heretofore described as having polyisoprene as its main component, a negative type) was employed as the photoresist, while a mixed solution consisting of HF and $NH_4F$ at 1 : 6 in volume ratio was employed as the etchant.

In case of $SiO_2$ as deposited, the etch factor was 1.3 – 1.5. When it was surface treated with 1,4-butanediol (HO-$(CH_2)_4$-OH) and 1,3-propanediol (HO—$(CH_2)_2$—OH), the etch factor became 0.7 – 1.0 in both the cases.

Conversely, when the specimen was surface-treated with the organic compounds given in Table 2, the etch factor became 1.5 – 1.8.

Embodiment 3

Further, description will be made of the photo-etching working of CVD·phosphorsilicate glass (abbreviated to PSG in this specification). As each specimen, there was used a CVD·PSG film deposited on a silicon wafer by oxidizing at 430°C. a mixed gas consisting of silane and phosphine.

The photoresist, the etchant and the other photo-etching conditions were all the same as in the case of CVD·$SiO_2$.

The etch factor of the CVD·PSG film as deposited depended on the concentration of phosphorus in the film, and became smaller as the phosphorus concentration was higher. In case of a phosphorus concentration of 4 mol %, the etch factor was 1.2, while in case of a phosphorus concentration of 8 mol %, it was 1.0. When the CVD·PSG film was surface-treated with 1,3-butanediol ($CH_3CH(OH)(CH_2)_2OH$) and 1,2-propanediol ($CH_3CH(OH)CH_2OH$), the etch factor became 0.6 – 0.8 independently of the phosphorus concentraton.

Where the surface treatments were made with the organic compounds given in Table 2, the etch factor increased as in Embodiment 2. It was found that, even in this case, the degree of side-etch was independent of the phosphorus concentration.

Embodiment 4

A solution in which 10 gr. of phenol was dissolved in 60 ml of n-hexane, and a specimen in which a polycrystalline silicon thin film was deposited on a silicon wafer, with its surface oxidized by 5,000A, by the thermal decomposition of silane at 650°C. were placed in a stainless steel-made autoclave of a capacity of 200 ml.

Subsequently, air within the autoclave was replaced by dry nitrogen, and the autoclave was hermetically closed. While measuring the temperature and pressure within the autoclave, the autoclave was gradually heated to 235°C. (the rate of rising the temperature was about 8°C/min.). The raised temperature was held for 30 minutes, to give rise to the reaction. Meantime, the pressure within the autoclave was 38 atmospheres. Finally, the autoclave was opened, had vapor in the interior blown out, and was let to stand for cooling.

Thereafter, the specimen was processed similarly to Embodiment 1. When the etch factor was measured, it was 0.02.

Embodiment 5

In a stainless steel-made autoclave having a capacity of 200 ml, there were placed a solution (surface-treating agent) in which 13 ml of n-octanol and 10 gr. of phenol were dissolved in 60 ml of n-hexane and a material in which a polycrystal silicon thin film was deposited on a silicon wafer, with its surface oxidized by 5,000A, by the thermal decomposition of monosilane at 650°C.

The specimen was surface-treated by the same treatment method as in Embodiment 4. Thereafter, the etch factor was measured in the same way as in Embodiment 1. Then, a value of 0.05 was obtained.

Besides the foregoing, combinations between phenols and alcohols as hereunder mentioned can also achieve similar effects.

Phenols;

aliphatic-, aromatic-, amino- and halogen-derivatives of phenols such as phenol, cresol, anol, thymol, hydroxydiphenyl, aminophenol and chlorophenol.

Alcohols;

primary and secondary alcohols, unsaturated alcohol, aromatic alcohol, halogenoalcohol, aminoalcohol, nitroalcohol, diol, etc.

As described above, according to the present invention, a thin film material such as silicon and oxides thereof is surface-treated with an organic compound, to deliberately control the property of the surface of the thin film, whereby the degree of side-etch is controlled, making it possible to control the profile of an etched secton in the photo-etching working.

In addition, the reproducibility of the finishing accuracy can be made extraordinarily good irrespective of the history of the thin film.

That is, the present invention brings forth much excellent results over the conventional method in points of the control of the profile of an etched section and the reproduciling of the accuracy of finishing, and is greatly effective in practical use.

In the vapor phase reaction method described above, it will be understood that the minimum temperature is 50°C and that the pressure ranges from 0.1 Torr. to 1 atmosphere. In the autoclave method and the vapor phase reaction method, reaction times are 30 minutes or longer.

It also will be appreciated from the foregoing examples that the effect of the organic compound on the degree of side-etch is dependent upon the structure of the organic compound. Normal alcohols, silane derivatives and silylamine derivatives reduce the degree of side-etch; whereas, polyfunctional alcohols and phenols increase the degree of side-etch in a controlled manner. Moreover, suitable solvents for use with such organic compound include liquid alkanes.

Furthermore, it should be recognized that numerous photoresist materials may be used for the purpose of the subject invention and that the photo-etching technique per se is effected according to conventional procedures such as those disclosed by the manuals of Kodak.

Furthermore, it will also be recognized that in addition to silicon, the oxides of silicon and $Al_2O_3$ other oxide surfaces can be treated so long as the surfaces possess the characteristic of having chemisorbed hydroxy groups thereon.

While the novel embodiments of the inveniton have been described, it will be understood that various omissions, modifications and changes in these embodiments may be made by one skilled in the art without departing from the spirit and scope of the invention.

What is claimed is:

1. A photo-etching method comprising effecting reactor between an organic composition consisting essentialy of an organic compound selected from the group consisting of alcohols, phenols and phenol derivatives and the surface of a solid oxide thin film having chemisorbed hydroxy groups on said surface, at a temperature above the boiling point of said organic compound and at a pressure above atmospheric pressure in an autoclave, the temperature and pressure in said autoclave being sufficient so that said organic compound reacts with said chemisorbed hydroxyl groups, applying a film of a photosensitive organic polymer onto the solid oxide thin film, irradiating a predetermined area of the photosensitive organic polymer film by light, removing a portion of the polymer film by dissolution to form a mask having a predetermined pattern, and selectively etching said solid oxide film by means of said mask.

2. The photo-etching method according to claim 1, wherein said organic compound is selected from the group consisting of methanol, ethanol, n-propanol, n-butanol, n-pentanol and n-decanol.

3. The photo-etching method according to claim 1, wherein said organic compound is a polyfunctional alcohol.

4. The photo-etching method according to claim 1, wherein said phenol derivative is selected from the group consisting of an aliphatic-derivative, an aromatic-derivative, an amino-derivative and a halogen-derivative.

5. The photo-ething method of claim 1, wherein the alcohols are selected from the group consisting of unsaturated alcohols, aromatic alcohols, halogenoalcohols, aminoalcohols, and nitroalcohols.

6. The photo-etching method of claim 1, wherein said organic compound is selected from the group consisting of phenol, cresol, anol, thymol, hydroxydiphenyl, aminophenol and chlorophenol.

7. The photo-etching method of claim 1, wherein said organic compound is a mixture of at least two members selected from the group consisting of alcohols, phenols, and phenol derivatives.

8. The photo-etching method of claim 1, wherein said organic compound is a normal alcohol.

9. The photo-etching method of claim 1, wherein said organic composition contains a solvent for said organic compound.

* * * * *